US012638127B2

(12) United States Patent
Choi et al.

(10) Patent No.: US 12,638,127 B2
(45) Date of Patent: May 26, 2026

(54) DISPLAY DEVICE

(71) Applicant: LG ELECTRONICS INC., Seoul (KR)

(72) Inventors: Wonsuk Choi, Seoul (KR); Hyounggun Moon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 590 days.

(21) Appl. No.: 17/928,906

(22) PCT Filed: Jun. 4, 2020

(86) PCT No.: PCT/KR2020/007282
§ 371 (c)(1),
(2) Date: Nov. 30, 2022

(87) PCT Pub. No.: WO2021/246554
PCT Pub. Date: Dec. 9, 2021

(65) Prior Publication Data
US 2023/0228367 A1     Jul. 20, 2023

(51) Int. Cl.
| | |
|---|---|
| *H05K 5/02* | (2006.01) |
| *F16M 11/22* | (2006.01) |
| *G02F 1/1333* | (2006.01) |
| *H10K 59/80* | (2023.01) |

(52) U.S. Cl.
CPC ....... *F16M 11/22* (2013.01); *G02F 1/133314* (2021.01); *H05K 5/0234* (2013.01); *H10K 59/87* (2023.02); *F16M 2200/08* (2013.01)

(58) Field of Classification Search
CPC ....................................................... H05K 5/00
See application file for complete search history.

(56) References Cited

U.S. PATENT DOCUMENTS 2,836,745 A * 5/1958 Gillie ................... H01R 39/381
310/246

FOREIGN PATENT DOCUMENTS

| JP | 2015230460 | 12/2015 | |
| KR | 101857660 | 5/2018 | |
| WO | WO-2014160959 A1 * | 10/2014 | ............. F16M 11/10 |

OTHER PUBLICATIONS

Korean Intellectual Property Office Application No. 10-2022-7041970, Office Action dated Oct. 11, 2024, 5 pages.

* cited by examiner

*Primary Examiner* — Jerry Wu
(74) *Attorney, Agent, or Firm* — LEE, HONG, DEGERMAN, KANG & WAIMEY

(57) ABSTRACT

A display device is disclosed. The display device of the present disclosure includes: a display panel; a frame disposed at a rear of the display panel and coupled to the display panel; a pair of stands coupled to a lower side of the frame and spaced apart from each other; a bar elongated and connecting the pair of stands; and a clip disposed between the bar and at least one of the pair of stands, fixed to at least one of the pair of stands or the bar, and removably coupled to the bar or at least one of the pair of stands.

14 Claims, 14 Drawing Sheets

DISPLAY DEVICE

CROSS-REFERENCE TO RELATED APPLICATIONS

This application is the National Stage filing under 35 U.S.C. 371 of International Application No. PCT/KR2020/007282, filed on Jun. 4, 2020, the contents of which are all incorporated by reference herein in their entirety.

TECHNICAL FIELD

The following description relates to a display device.

BACKGROUND ART

With the development of the information society, there have been growing demands for various types of display devices, and in order to meet these demands, various display devices, such as a liquid crystal display (LCD), a plasma display panel (PDP), an electroluminescent display (ELD), a vacuum fluorescent display (VFD), an organic light emitting diode (OLED), etc., have been studied and used recently.

Among them, the LCD panel includes a TFT substrate and a color substrate which are positioned opposite each other with a liquid crystal layer interposed therebetween, and displays images by using light emitted from a backlight unit. Further, the OLED panel may display images by depositing a self light-emitting organic layer on a substrate on which transparent electrodes are formed.

Recently, structural characteristics of a display device with a stand are actively researched.

DISCLOSURE OF INVENTION

Technical Problem

It is an objective of the present disclosure to solve the above and other problems.

It is another objective of the present disclosure to provide a display device including a pair of stands to improve structural stability.

It is yet another objective of the present disclosure to provide a display device including a bar connecting a pair of stands to further improve structural stability.

Technical Solution

According to an aspect of the present disclosure in order to achieve the above and other objectives, there is provided a display device including: a display panel; a frame disposed at a rear of the display panel and coupled to the display panel; a pair of stands coupled to a lower side of the frame and spaced apart from each other; a bar elongated and connecting the pair of stands; and a clip disposed between the bar and at least one of the pair of stands, fixed to at least one of the pair of stands or the bar, and removably coupled to the bar or at least one of the pair of stands.

Advantageous Effects of Invention

According to at least one of the embodiments of the present disclosure, a display device includes a pair of stands, such that structural stability of the display device may be improved.

According to at least one of the embodiments of the present disclosure, a display device includes a bar connecting a pair of stands, such that structural stability of the display device may be further improved.

Further scope of applicability of the present disclosure will become apparent from the detailed description given hereinafter. However, it should be understood that the detailed description and specific examples, while indicating preferred embodiments of the present disclosure, are given by illustration only, since various changes and modifications within the spirit and scope of the present disclosure will become apparent to those skilled in the art from this detailed description.

MODE FOR THE INVENTION

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the present application, it should be understood that the terms "comprises, includes," "has," etc. specify the presence of features, numbers, steps, operations, elements, components, or combinations thereof described in the specification, but do not preclude the presence or addition of one or more other features, numbers, steps, operations, elements, components, or combinations thereof.

Figure 1:
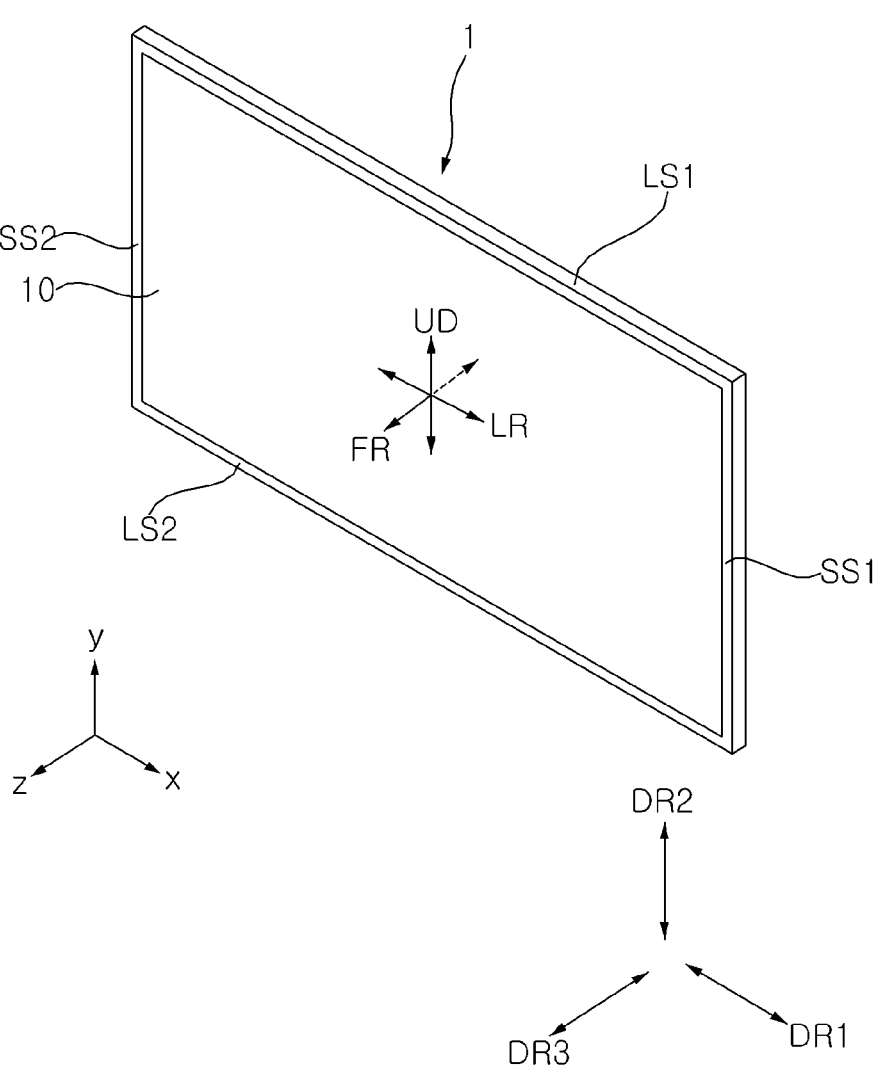
FIGS. 1 to 14 are diagrams illustrating examples of a display device according to embodiments of the present disclosure.

Referring to FIG. 1, a display device 1 may include a display panel 10. The display panel 10 may display images.

The display panel 10 may include a first long side LS1, a second long side LS2 opposite to the first long side LS1, a first short side SS1 adjacent to the first long side LS1 and the second long side LS2, and a second short side SS2 opposite to the first short side SS1. For convenience of explanation, it is illustrated and described that the first and second long sides LS1 and LS2 are longer than the first and second short sides SS1 and SS2, but there may also be a case in which lengths of the first and second long sides LS1 and LS2 may be approximately equal to lengths of the first and second short sides SS1 and SS2.

A direction parallel to the long sides LS1 and LS2 of the display device 1 may be referred to as a first direction DR1 or a left-right direction LR. A direction parallel to the short sides SS1 and SS2 of the display device 1 may be referred to as a second direction DR2 or an up-down direction UD. A direction perpendicular to the long sides LS1 and LS2 and the short sides SS1 and SS2 of the display device 1 may be referred to as a third direction DR3 or a front-rear direction FR. Here, a side on which the display panel 10 displays an image may be referred to as a front side, and a side opposite thereto may be referred to as a rear side.

Hereinafter, the display device 1 including the display panel 10 as an LCD panel will be described as an example with reference to FIGS. 2 to 4, and a display device 1' including a display panel 10' as an OLED panel will be described as another example with reference to FIG. 5. However, the display device applicable to the present disclosure is not limited to these display devices.

Figure 2:
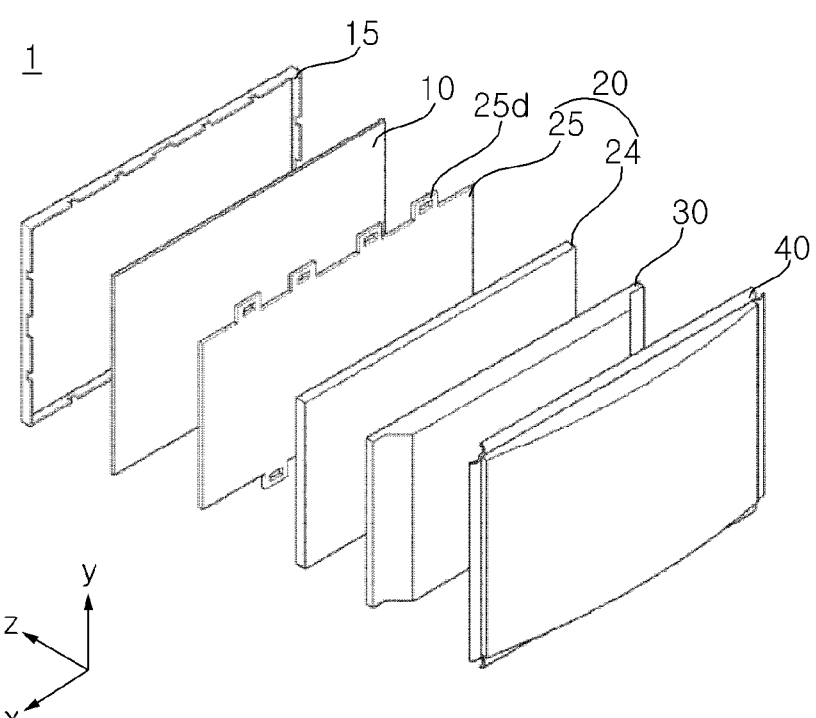

Referring to FIG. 2, the display device 1 may include the display panel 10, a front cover 15, a backlight unit 20, a frame 30, and a back cover 40. Here, the display panel 10 may be referred to as an LCD panel.

The front cover 15 may cover at least a partial region of a front surface and a side surface of the display panel 10. The front cover 15 may be divided into a front cover disposed on a front surface of the display panel 10 and a side cover disposed on a side surface thereof. The front cover and the side cover may be provided separately. Any one of the front cover and the side cover may be omitted.

The display panel 10 may be provided on the front surface of the display device 1 may display images. The display panel 10 may display images with each of a plurality of pixels having Red, Green, and Blue (RGB) values output according to timing. The display panel 10 may be divided into an active area, in which the image is displayed, and a de-active area in which the image is not displayed. The display panel 10 may include a front substrate and a rear substrate which are disposed opposite each other with respect to a liquid crystal layer interposed therebetween.

The front substrate may include a plurality of pixels, each including Red, Green, and Blue subpixels. The front substrate may output light corresponding to red, green, or blue color in response to a control signal.

The rear substrate may include switching elements. The rear substrate may switch pixel electrodes. For example, the pixel electrodes may change a molecular arrangement of a liquid crystal layer in response to a control signal applied from the outside. The liquid crystal layer may include a plurality of liquid crystal molecules. The arrangement of the liquid crystal molecules may be changed in response to a difference in voltage applied between the pixel electrode and the common electrode. The liquid crystal layer may transfer light, generated from the backlight unit 20, to the front surface or may block the light.

The backlight unit 20 may be disposed at the rear of the display panel 10. The backlight unit 20 may include light sources. The backlight unit 20 may be coupled to the frame 50 at the front of the frame 50. The backlight unit 20 may be driven by an entire driving method or a partial driving method such as a local dimming method, an impulsive driving method, and the like. The backlight unit 20 may include an optical sheet 25 and an optical layer 24.

The optical sheet 25 may enable light from the light sources to be uniformly transmitted to the display panel 10. The optical sheet 25 may include a plurality of layers. For example, the optical sheet 25 may include a prism sheet or a diffusion sheet.

The optical sheet 25 may include a coupling part 25d. The coupling part 25d may be coupled to the front cover 15, the frame 30 and/or the back cover 40. Alternatively, the coupling part 25d may be fastened to a structure formed on or coupled to the front cover 15, the frame 30 and/or the back cover 40.

The frame 30 may be disposed at the rear of the backlight unit 20 and may support the components of the display device 1. For example, the backlight unit 20, a Printed Circuit Board (PCB) on which a plurality of electronic elements are mounted, and the like may be coupled to the frame 30. The frame 30 may include a metal material, such as aluminum alloy and the like. Meanwhile, the frame 30 may be referred to as a main frame or a module cover.

The back cover 40 may be disposed at the rear of the display device 1. The back cover 40 may cover the rear side of the display panel 10. The back cover 40 may be coupled to the frame 30 and/or the front cover 15. For example, the back cover 40 may be an injection molded product made of a resin material. However, the back cover 40 may also include a metal material.

Figure 3:
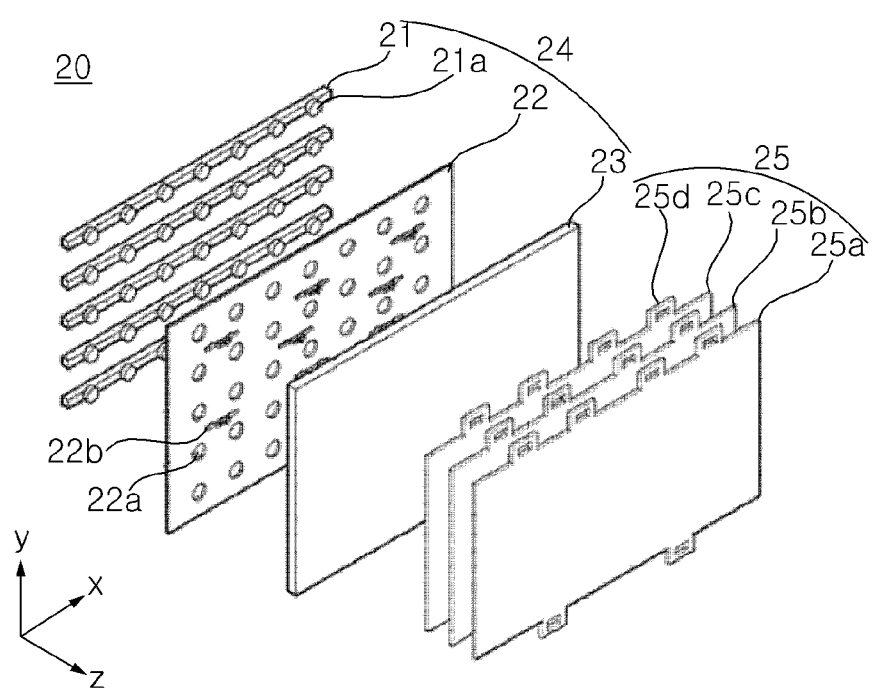

Referring to FIG. 3, the backlight unit 20 may include the optical layer 24 including a substrate 21, at least one light assembly 21a, a reflective sheet 22, and a diffusion plate 35, and the optical sheet 25 disposed at the front of the optical layer 24.

The substrate 21 may be formed in the shape of a plurality of straps which extend in the left-right direction LR and are spaced apart from each other in the up-down direction UD. The at least one light assembly 21a may be mounted on the substrate 21. An electrode pattern for connecting an adapter and the light assembly 21a may be formed on the substrate 21. For example, a carbon nanotube electrode pattern for connecting the adapter and the light assembly 21a may be formed on the substrate 21.

The substrate 21 may be made of at least one of polyethylene terephthalate (PET), glass, polycarbonate (PC), and silicon. The substrate 21 may be a Printed Circuit Board (PCB) on which the at least one light assembly 21a is mounted.

The light assembly 21a may be a light emitting diode (LED) chip or a light emitting diode package including at least one LED chip. The light assembly 21a may be a colored LED emitting at least one of red, green, and blue light, or a white LED. The colored LED may include at least one of a red LED, a green LED, and a blue LED.

The reflective sheet 22 may be disposed at the front of the substrate 21. The reflective sheet 22 may have a plurality of through holes 22a in which the light assembly 21a is disposed. The reflective sheet 22 may forwardly reflect light emitted from the light assembly 21a or light reflected from the diffusion plate 23. For example, the reflective sheet 22 may include metal and/or metal oxide having high reflectance, such as at least one of aluminum (Al), silver (Ag), gold (Au), and titanium dioxide (TiO$_2$).

Further, an air gap may be formed between the reflective sheet 22 and the diffusion plate 23. The air gap may act as a buffer capable of widely spreading light emitted from the light assembly 21*a*. A supporter 22*b* may be disposed between the reflective sheet 22 and the diffusion plate 23, so as to keep the air gap.

The diffusion plate 23 may be disposed at the front of the reflective sheet 22. The diffusion plate 23 may be disposed between the reflective sheet 22 and the optical sheet 25.

The optical sheet 25 may include at least one or more sheets. Specifically, the optical sheet 25 may include one or more prism sheets and/or one or more diffusion sheets. A plurality of sheets included in the optical sheet 25 may be bonded to each other or may be in close contact with each other.

The optical sheet 25 may include a plurality of sheets having different functions. For example, the optical sheet 25 may include a first optical sheet 25*a*, a second optical sheet 25*b*, and a third optical sheet 25*c*. For example, the first optical sheet 25*a* is a diffusion sheet, and the second optical sheet 25*b* and the third optical sheet 25*c* may be prism sheets. The number and/or position of the diffusion sheet and the prism sheet may vary. The diffusion sheet may prevent light emitted from the diffusion plate 23 from being partially concentrated, so that light may be distributed uniformly. The prism sheet may concentrate light emitted from the diffusion sheet 23 and may redirect light to the display panel 10.

Figure 4:
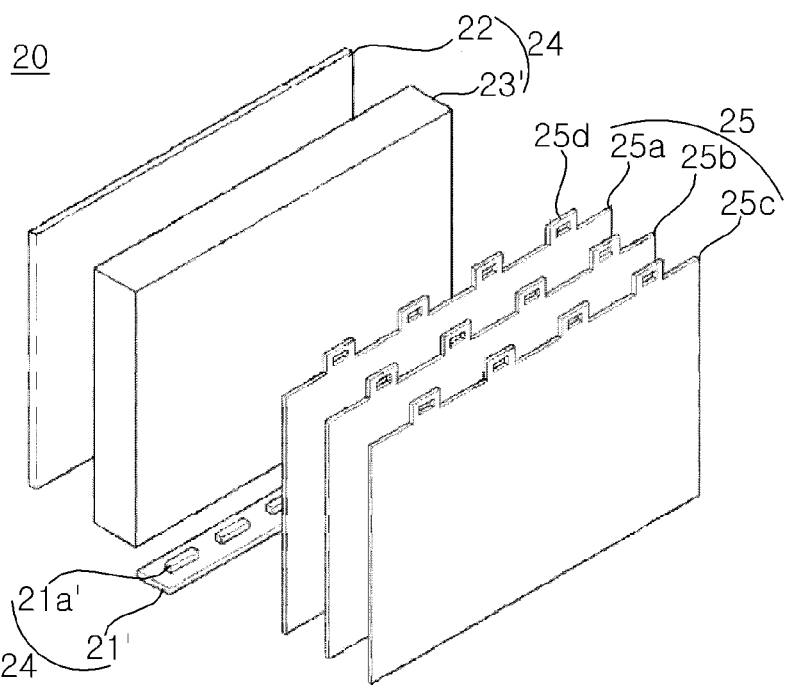

Referring to FIG. 4, the light sources of the backlight unit 20 may be disposed at edges thereof. The backlight unit 20 may include the optical layer 24 including a substrate 21', at least one light assembly 21*a'*, a reflective sheet 22, and a light guide plate 23', and the optical sheet 25 disposed at the front of the optical layer 24.

The substrate 21' may extend in the left-right direction LR and may be disposed adjacent to a lower side of the light guide plate 23'. At least one light assembly 21*a'* may be mounted on the substrate 21'. Accordingly, most of the light emitted from the light assembly 21*a'* may be transferred to the inside of the light guide plate 23'. Here, the light guide plate 23' may forwardly reflect light incident from the light assembly 21*a'*. Meanwhile, the diffusion plate 23 (not shown) may also be provided on a front surface of the light guide plate 23'.

The reflective sheet 22 may be disposed at the rear of the light guide plate 23'. The reflective sheet 22 may forwardly reflect light emitted from the light assembly 21*a'* or light reflected thereto from the light guide plate 23'.

Figure 5:
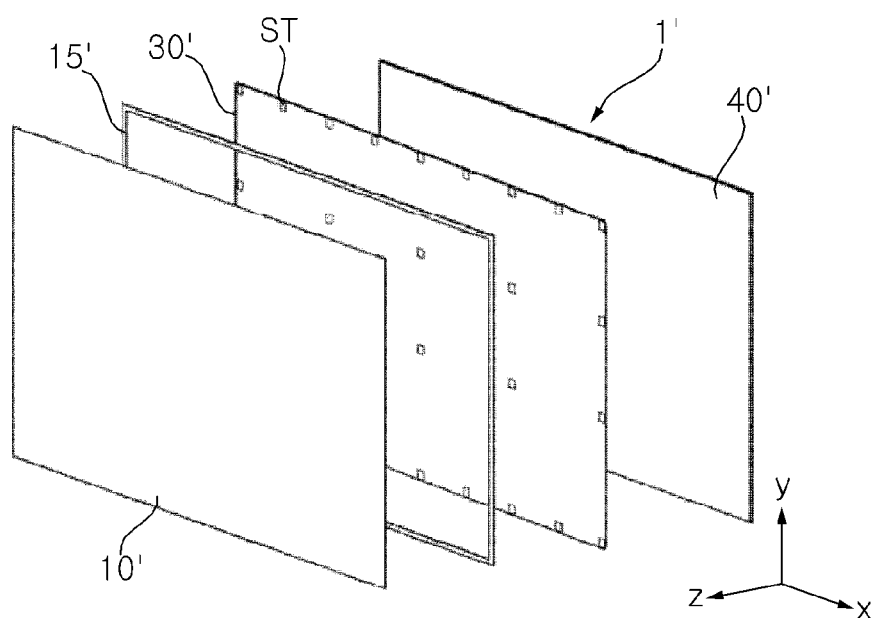

Referring to FIG. 5, unlike the above examples, a display device 1' may include a display panel 10', a middle frame 15', a frame 30', and a back cover 40'. Here, the display panel 10' may be referred to as an OLED panel, and the display device 1', requiring no backlight unit, may be formed as an ultra-thin display device.

The display panel 10' may form a front surface of the display device 1' and may display images on the front side thereof. The display panel 10' may divide the image into a plurality of pixels and may output the image while controlling color, brightness, and chroma of the respective pixels. The display panel 10' may be divided into an active area, in which the image is displayed, and a de-active area in which the image is not displayed. The display panel 10' may generate light corresponding to red, green, or blue color in response to a control signal.

The middle frame 15' may form a side surface of the display device 1'. The middle frame 15' may be disposed at the rear of the display panel 10' and may be coupled to the display panel 10'. The middle frame 15' may have a generally rectangular ring shape. For example, the middle frame 15' may include a metal material. Accordingly, the middle frame 15' may improve torsional and/or bending rigidity of the display device 1'. Meanwhile, the middle frame 15' may be referred to as an inner frame, a middle cabinet, or a panel guide.

The frame 30' may be coupled to the middle frame 15' at the rear of the middle frame 15'. A Printed Circuit Board (PCB), on which a plurality of electronic elements are mounted, may be coupled to the frame 30'. Meanwhile, the frame 30' may be referred to as a main frame or a module cover.

The back cover 40' may be coupled to the frame 30' at the rear of the frame 30'. The back cover 40' may form a rear surface of the display device 1'. For example, the back cover 40' may be an injection molded product made of a resin material. However, the back cover 40' may also include a metal material.

Figure 6:
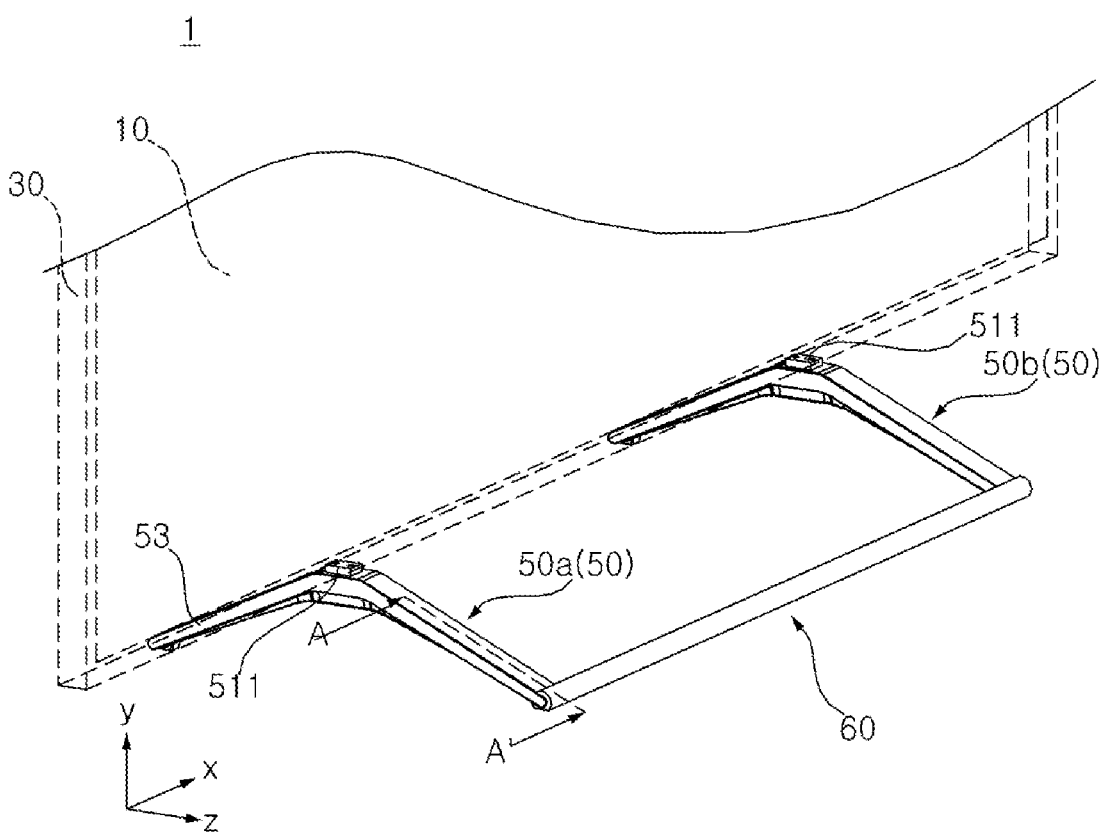

Referring to FIG. 6, a stand 50 may be coupled to a lower side of the frame 30 by a coupling part 511. For example, the frame 30 may form a lower surface of the display device 1, and the stand 50 may be directly coupled to the frame 30. In another example, the back cover 40 may form a lower surface of the display device 1, and the stand 50 may be coupled to the frame 30 by being coupled to the back cover 40. Meanwhile, the coupling part 511 may be coupled to the frame 30 at a plurality of points. In other words, the coupling part 511 may be adjusted to various positions relative to the frame 30 in response to a user's request.

The coupling part 511 may be formed at an upper side of the stand 50. For example, the coupling part 511 may have a generally block shape and may have a flat upper surface. In this case, the coupling part 511 may be removably coupled to the frame 30 by a fastening member such as a screw.

For example, the stand 50 may include a pair of stands 50*a* and 50*b* which are spaced apart from each other in the left-right direction. Here, the pair of stands 50*a* and 50*b* may include a right stand 50*a*, disposed adjacent to the right side of the display panel 10, and a left stand 50*b* disposed adjacent to the left side of the display panel 10. Accordingly, structural stability of the display device including the pair of stands may be improved compared to a case where the display device includes a single stand.

Meanwhile, the right stand 50*a* and the left stand 50*b* have the same configuration, such that the same description may be applied thereto. Hereinafter, the right stand 50*a* and the left stand 50*b* will be collectively referred to as the stand 50 for simple explanation.

For example, the stand 50 may include a metal material such as aluminum (Al). In another example, the stand 50 may include a plastic material.

Figure 7:
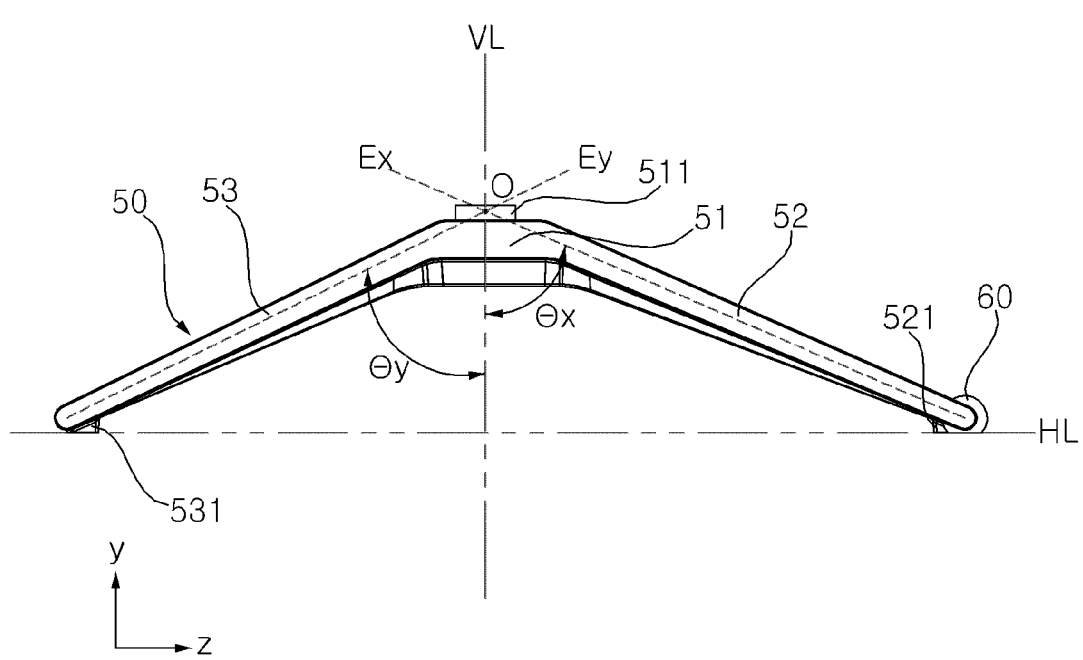

Referring to FIGS. 6 and 7, the stand 50 may include a body 51 having an upper side on which the coupling part 511 is provided, a first leg 52, and a second leg 53.

The body 51 may be disposed between the first leg 52 and the second leg 53 in the front-rear direction. A front surface of the body 51 may be coupled to the first leg 52, and a rear surface thereof may be coupled to the second leg 53. A lower surface of the body 51 may be upwardly spaced apart from a horizontal line HL parallel to the ground.

The first leg 52 and the second leg 53 may be symmetrical to each other with respect to a virtual vertical line VL extending vertically by passing through the center of the body 51. Specifically, the first leg 52 may be elongated forward and downward from the body 51. A first virtual extension line Ex, parallel to a longitudinal direction of the first leg 52, may be inclined forward at a first angle theta x with respect to the vertical line VL. In addition, the second leg 53 may be elongated rearward and downward from the body 51. A second virtual extension line Ey, parallel to a longitudinal direction of the second leg 53, may be inclined rearward at a second angle theta y with respect to the vertical line VL. For example, the first angle theta x and the second angle theta y may be acute angles and may be equal to each other. As the first angle theta x and the second angle theta y increase, the lower surface of the body 51 may be closer to the horizontal line HL.

A first supporter 521 may be provided at a lower end of the first leg 52. A lower surface of the first supporter 521 may be flat with respect to the horizontal line HL. A second supporter 531 may be provided at a lower end of the second leg 53. A lower surface of the second supporter 531 may be flat with respect to the horizontal line HL. Accordingly, by providing the first supporter 521 and the second supporter 531, the first leg 52 and the second leg 53 may be stably placed on the ground.

Figure 8:
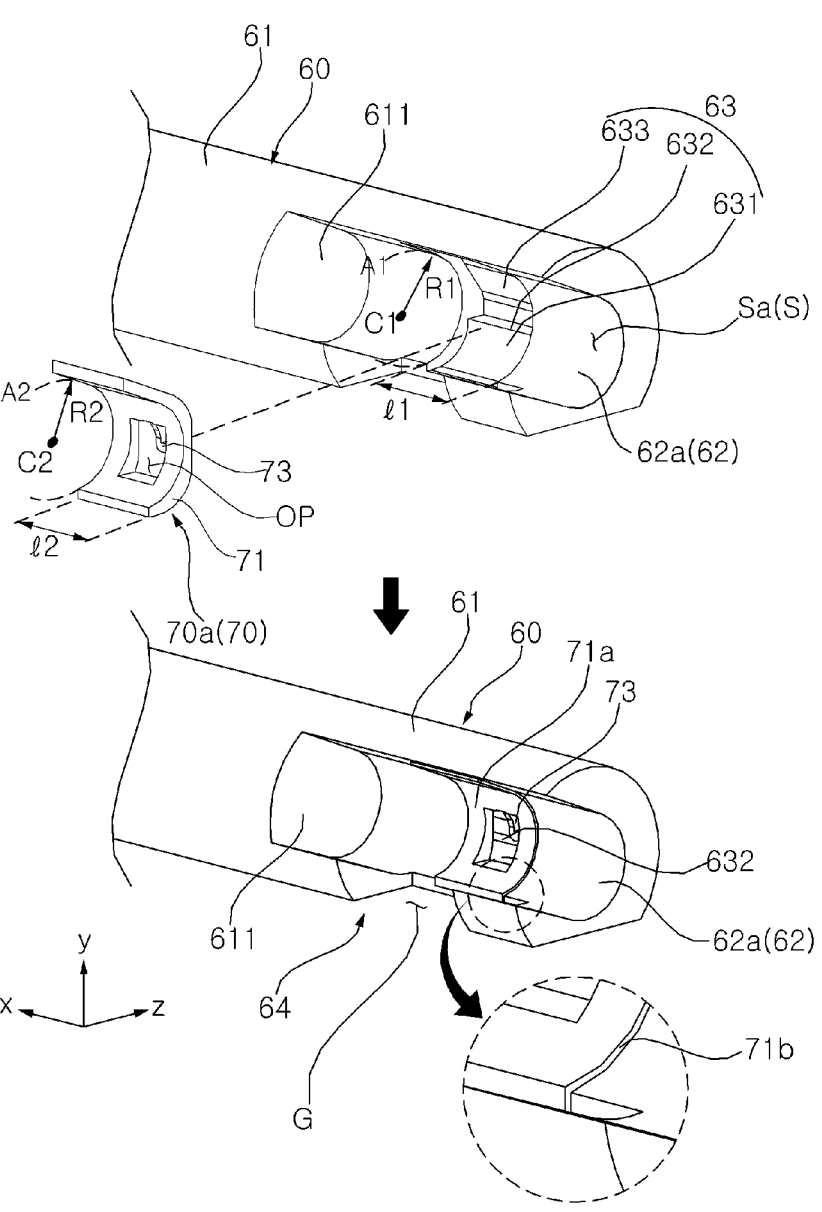

Referring to FIGS. 6 and 8, a bar 60 may be elongated in the left-right direction and may connect the pair of stands 50*a* and 50*b*. For example, the bar 60 may connect a front end of the right stand 50*a* and a front end of the left stand 50*b*. In another example, the bar 60 may connect a rear end of the right stand 50*a* and a rear end of the left stand 50*b*. In yet another example, the bar 60 may include a pair of bars spaced apart from each other in the front-rear direction. In this case, any one of the pair of bars 60 may connect the front end of the right stand 50*a* and the front end of the left stand 50*b*, and the other one thereof may connect the rear end of the right stand 50*a* and the rear end of the left stand 50*b*.

The bar 60 may include a body 61 and a coupling part 62. The body 61 may be elongated in the left-right direction. For example, the body 61 may have a generally cylindrical shape, but an outer circumferential surface thereof is partially cut out such that the body 61 may have a flat lower surface with respect to the ground. Meanwhile, although not illustrated herein, the body 61 may have an adjustable length. Accordingly, the length of the body 61 may be adjusted according to a distance between the pair of stands 50. To this end, the body 61 may include, for example, two or more rods having different diameters and coupled to each other in the left-right direction. In this case, a rod having a relatively smaller diameter may be coupled to the inside of a rod having a relatively larger diameter, so as to be movable in the left-right direction.

The coupling part 62 may include a right coupling part 62*a*, formed at a right end of the body 61, and a left coupling part 62*b* formed at a left end of the body 61. In this case, the right coupling part 62 may be removably coupled to the front end of the right stand 51*a*, and the left coupling part 62*b* may be removably coupled to the front end of the left stand 50*b*. For example, the right coupling part 62*a* and the left coupling part 62*b* may be symmetrical to each other in the left-right direction. In this case, description of the right coupling part 62*a* may also be applied to the left coupling part 62*b*. For simple explanation, the following description will be focused on the right coupling part 62*a*, and the right coupling part 62*a* may be referred to as the coupling part 62.

The coupling part 62 may be recessed from the body 61 toward the inside of the body 61, to provide a space S in which the stand 50 is partially inserted. The coupling part 62 may include a fixing part 63 which is recessed from the coupling part 62 toward the inside of the coupling part 62, and to which a clip 70 to be described later is fixed. For example, at least a portion of the coupling part 62 may form a boundary of the fixing part 63, may overlap a first virtual arc A1, and may have a first radius of curvature R1 with respect to a first center of curvature C.

The fixing part 63 may include a first part 631, a second part 632, and a third part 633. The first part 631 may be recessed from the coupling part 62 toward the inside of the coupling part 62, and the third part 633 may be recessed from the first part 631 toward the inside of the first part 631 to form a step. In this case, the second part 632 may be a part corresponding to the step formed between the first part 631 and the third part 633. In other words, the second part 632 may connect the first part 631 and the third part 633.

The clip 70 may be disposed between the bar 60 and at least one of the pair of stands 50*a* and 50*b*. The clip 70 may be fixed to at least one of the pair of stands 50*a* and 50*b* or the bar 60, and may be removably coupled to the bar 60 or at least one of the pair of stands 50*a* and 50*b*.

For example, the clip 70 may include a right clip 70*a* fixed to the right coupling part 62*a* and a left clip 70*b* fixed to the left coupling part 62*b*. In this case, the right clip 70*a* may be removably coupled to the front end of the right stand 50*a*, and the left clip 70*b* may be removably coupled to the front end of the left stand 50*b*. For example, the right clip 70*a* and the left clip 70*b* may be symmetrical to each other in the left-right direction. In this case, description of the right clip 70*a* may also be applied to the left clip 70*b*. For simple explanation, the following description will be focused on the right clip 70*a*, and the right clip 70*a* may be referred to as the clip 70.

The clip 70 may be inserted into the fixing part 63 and fixed to the fixing part 63. For example, a horizontal width 12 of the clip 70 may be greater than a horizontal width 11 of the fixing part 63, such that the clip 70 may be fixed to the fixing part 63 in a tight-fit manner. For example, a body 71 of the clip 70 may have a hole OP. Further, a protruding part 73 of the clip 70 may protrude from the body 71 toward the fixing part 63 at a position adjacent to the hole OP. In this case, as the body 71 makes contact with the first part 631, and the protruding part 73 may be placed on the second part 632 while making contact with the third part 633. Here, the clip 70 may include an elastic material.

Accordingly, the body 71 may be spaced apart from the third part 633 in a region in which the protruding part 73 is disposed. In this case, when external force is applied to the clip 70, fixed to the fixing part 63, in an inward direction of the coupling part 62, the protruding part 73 is elastically deformed such that the body 71 may move toward the third part 633 in the region in which the protruding part 73 is disposed. As a result, the body 71 may be widened as compared to before applying the external force. In this regard, the hole OP is formed by cutting a portion of the body 71, and may reduce the rigidity of the body 71 so that the body 71 may be easily deformed. In addition, a hole (not numbered) may also be formed in the protruding part 73 so that the protruding part 73 may be elastically deformed easily.

Meanwhile, a portion of the body 71 may overlap a second virtual arc A2 and may have a second radius of curvature R2 with respect to a second center of curvature C2. In this case, a remaining portion of the body 71 may be flat. Further, the second radius of curvature R2 may be smaller than the first radius of curvature R1. Accordingly, coupling force between the stand 50 and the clip 70 may increase when the stand 50 is coupled to the clip 70*a*, compared to the case where the stand 50 is coupled to the coupling part 62.

In addition, when the clip 70 is fixed to the fixing part 63, a portion of the clip 70 may protrude from the coupling part 62. In other words, a portion 71*b* of the side surface of the clip 70 fixed to the fixing part 63 may be stepped with respect to the coupling part 62. Accordingly, it is possible to prevent coupling between the clip 70 and the stand 50 from being restricted by the coupling part 62.

Figure 9:
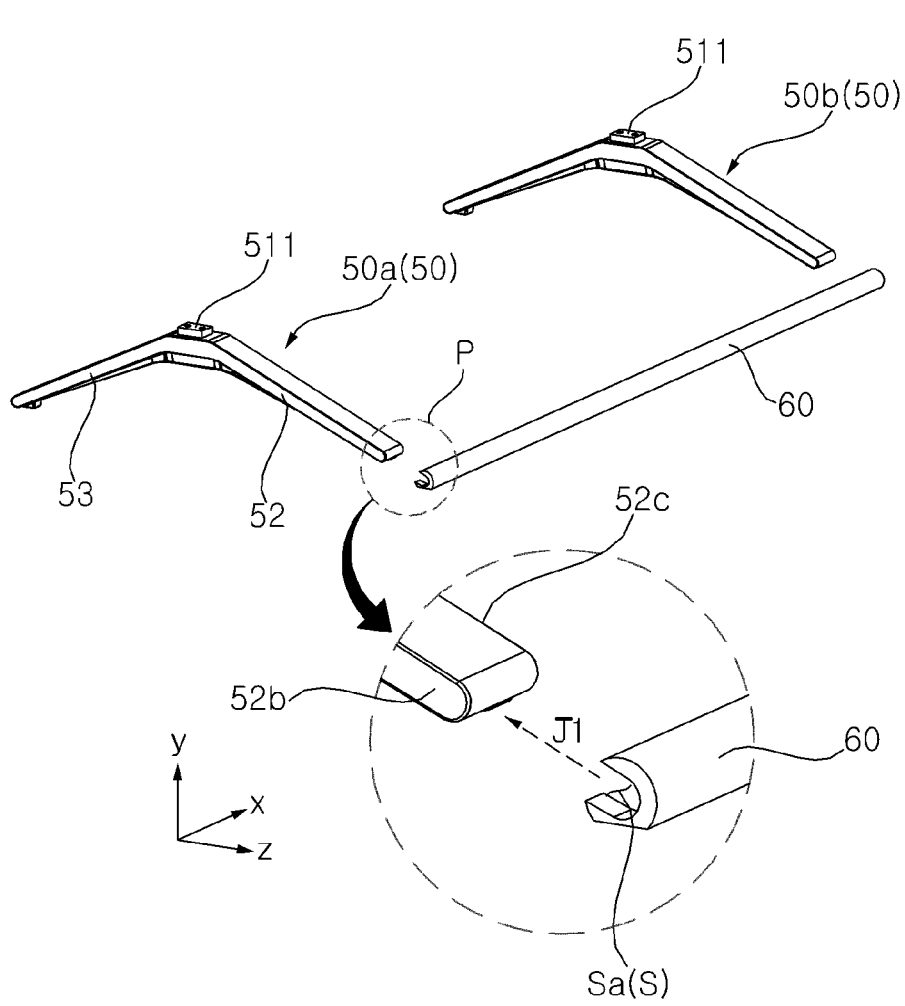
Figure 10:
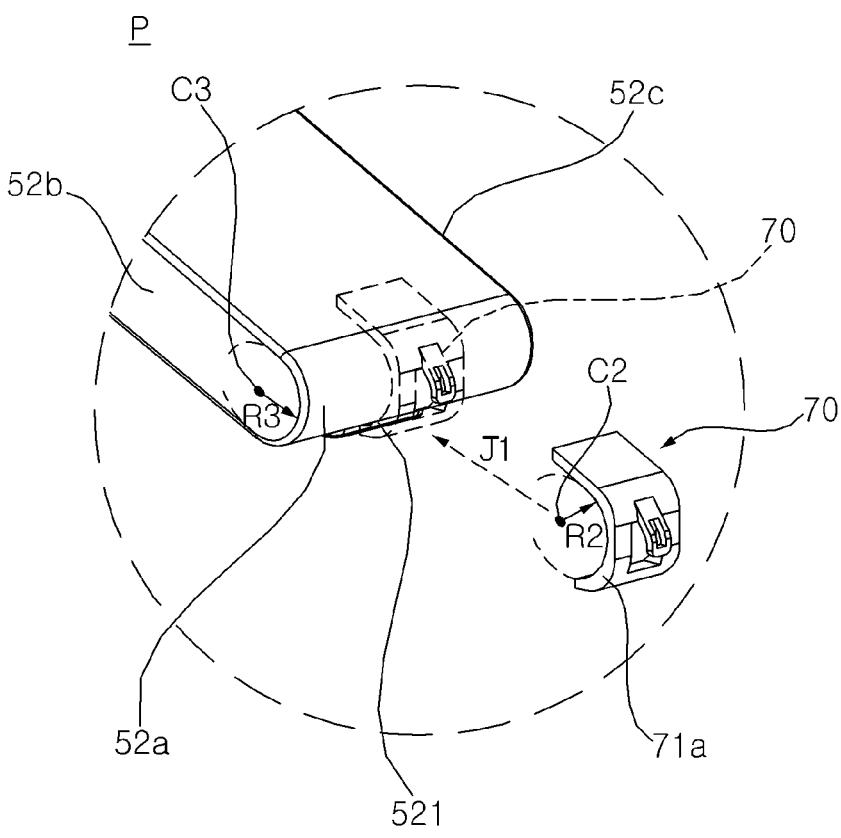

Referring to FIGS. 9 and 10, the first leg 52 of the stand 50 may include a first surface 52a facing the bar 60, a second surface 52b disposed at the right of the first surface 52a and forming a right surface of the first leg 52, and a third surface 52c disposed at the left of the first surface 52a and forming a left surface of the first leg 52. Here, FIG. 10 is an enlarged view of portion P of FIG. 9.

A portion of the first surface 52a that faces a curved portion of the body 71 of the clip 70 may be curved and may have a third radius of curvature R3 with respect to a third center of curvature C3. In this case, a remaining portion of the first surface 52a may be flat so as to come into contact with a flat portion of the body 71.

Further, when the clip 70 is removed from the stand 50, the third radius of curvature R3 may be greater than the second radius of curvature R2. In other words, when a user moves the bar 60 in a first direction J1 to connect the bar 60 to the stand 50, the curved portion of the body 71 is gradually widened (i.e., curvature gradually decreases), to be fastened to the curved portion of the first surface 52a. Here, the curvature is the reciprocal of the radius of curvature.

Accordingly, while the clip 70 is coupled to the stand 50, coupling between the clip 70 and the stand 50 may be maintained by a force of the curved portion of the body 71 to return to its original state (i.e., force to return to an initial curvature), unless an external force greater than or equal to a predetermined level is applied.

Accordingly, by providing the bar 60 that connects the pair of stands 50, structural stability of the display device may be improved. In other words, in the case where the display device includes the bar 60 connecting the pair of stands 50, wobble is reduced such that the display device may be supported more stably, compared to the case where the display device includes only the pair of stands 50. Further, as the bar 60 may be coupled to or removed from the pair of stands 50 by a user as needed, various options for support components of the display device may be provided to the user.

Meanwhile, the bar 60 may include a metal material such as aluminum. For example, the clip 70 may include a plastic material. In this case, compared to the case where the bar 60 of a metal material is directly coupled to the first surface 52a, the clip 70 of a plastic material may be suitable for preventing damage to the first surface 52a when the clip 70 is coupled to the first surface 52a. In another example, the clip 70 may include a metal material such as aluminum (Al). In this case, a protective material such as felt attached to the clip 70 may be provided between the first surface 52a and the clip 70, thereby preventing damage to the first surface 52a when the bar 60 is coupled to the stand 50.

Meanwhile, the coupling part 62 (see FIG. 8) may be elongated from the side surface of the bar 60 in a longitudinal direction of the bar 60. In this case, when the bar 60 is coupled to the stand 50, the second surface 52b of the first leg 52 may be exposed to the outside. In this case, when the bar 60 is coupled to the stand 50, the third surface 52c of the first leg 52 may come into contact with one surface 611 (see FIG. 8) of the body 61.

Figure 11:
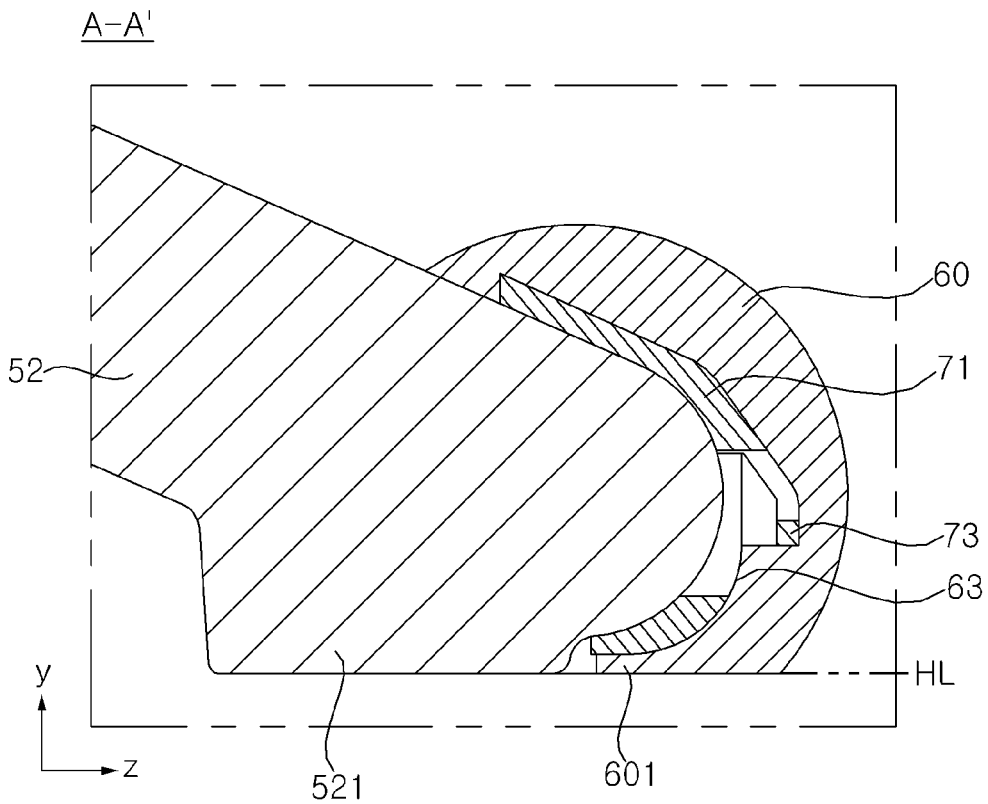

Referring to FIGS. 6 and 11, when the bar 60 is coupled to the stand 50, the body 71 of the clip 70 may come into close contact with the first leg 52 of the stand 50. Here, FIG. 11 is cross-sectional view taken along line A-A' of FIG. 6.

In this case, the bar 60 receives the clip 70 therein, while partially covering the first leg 52. In this manner, the clip 70, which serves to mediate coupling between the bar 60 and the stand 50, may not be exposed to the outside.

Referring back to FIGS. 8, 10, and 11, a first supporter 521 may be disposed at a lower side of the first surface 52a of the first leg 52. In this case, a cover part 64 may pass through a portion of the coupling part 62, and may form a boundary of a space G in which the first supporter 521 is inserted. In this manner, when the bar 60 is coupled to the stand 50, the first supporter 521 is disposed on the space G, and a side surface of the first supporter 521 may be covered by the cover part 64.

Meanwhile, a lower surface of the first supporter 521 and a lower surface 601 of the bar 60 may be flat with respect to a virtual horizontal line HL parallel to the ground. In this manner, the stand 50 may be maintained level with respect to the ground before and after the bar 60 is coupled to stand 50.

Figure 12:
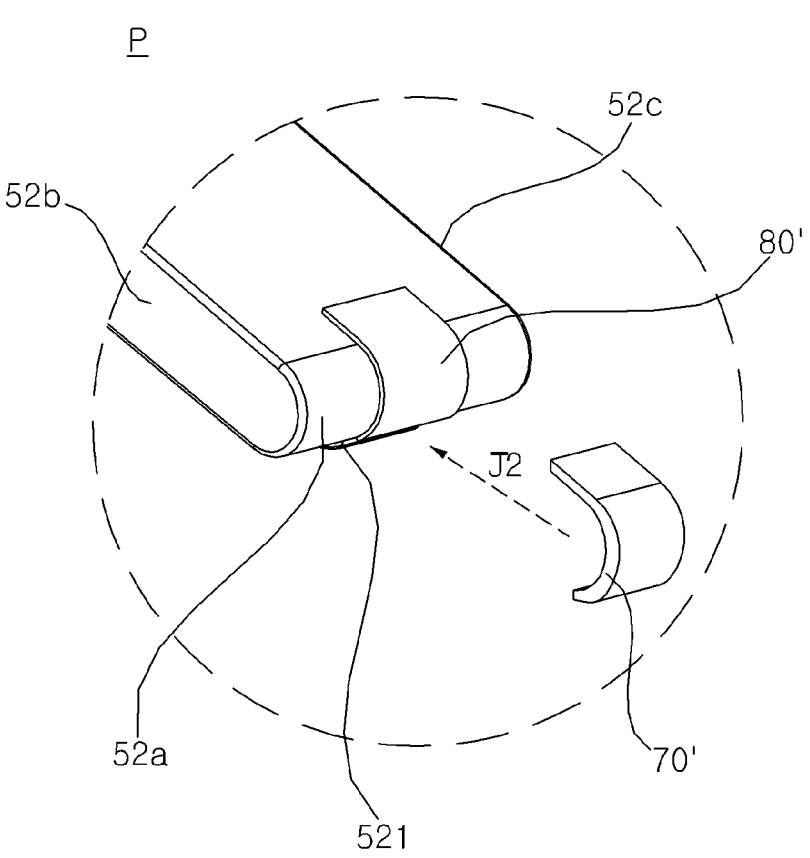

Referring to FIGS. 9 and 12, instead of the clip 70, a member 70' is fixed to the bar 60, and the bar 60 may be removably coupled to the first leg 52 of the stand 50 by the member 70'.

For example, the member 70' may be an adhesive member such as double-sided tape. In this case, one surface of the member 70' may be coupled to the bar 60, and the other surface thereof, which is opposite the one surface, may be coupled to the first surface 52a of the stand 50.

In another example, the member 70' may be a first Velcro. In this case, the member 70' may be fixed to the bar 60, and an auxiliary member 80' facing the member 70' and coupled to the member 70' may be formed on the one surface 52a of the stand 50. In this case, the auxiliary member 80' may be a second Velcro, and may be attached to the member 70' by Velcro.

Figure 13:
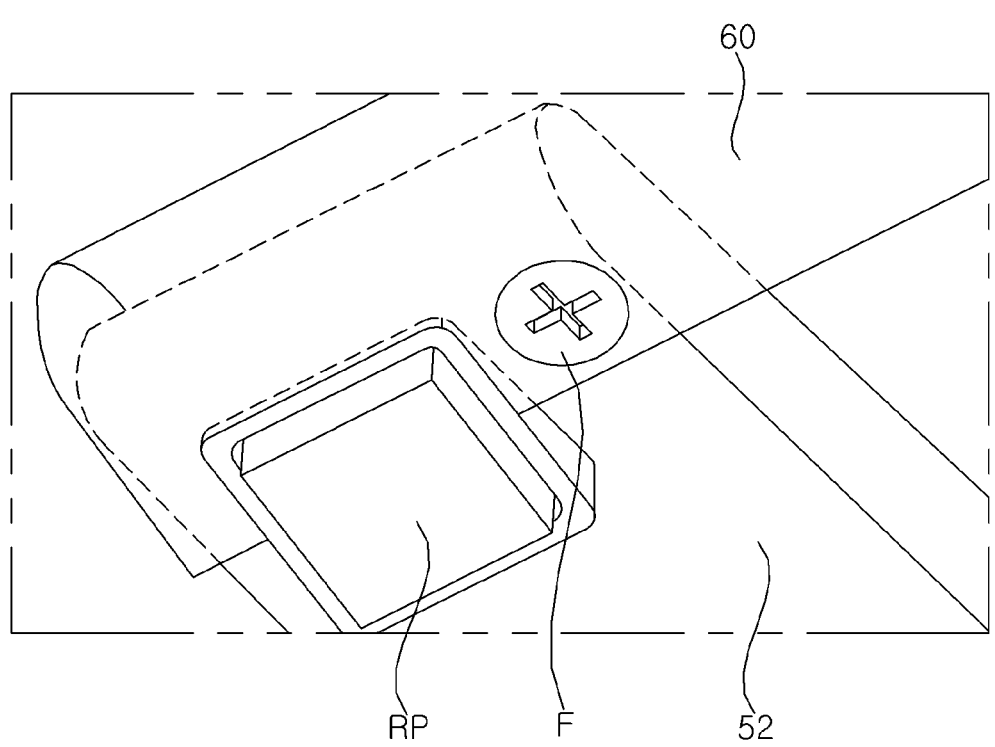

Referring to FIG. 13, a bar-hole, through which a fastening member F such as a screw may pass, may be formed in a lower surface of the bar 60. Further, a leg-hole, facing the bar-hole, may be formed in a lower surface of the first leg 52 of the stand 50.

In this case, the fastening member F, such as a screw, passes through the bar-hole to be fastened to the leg-hole, such that the bar 60 may be removably coupled to the stand 50.

Figure 14:
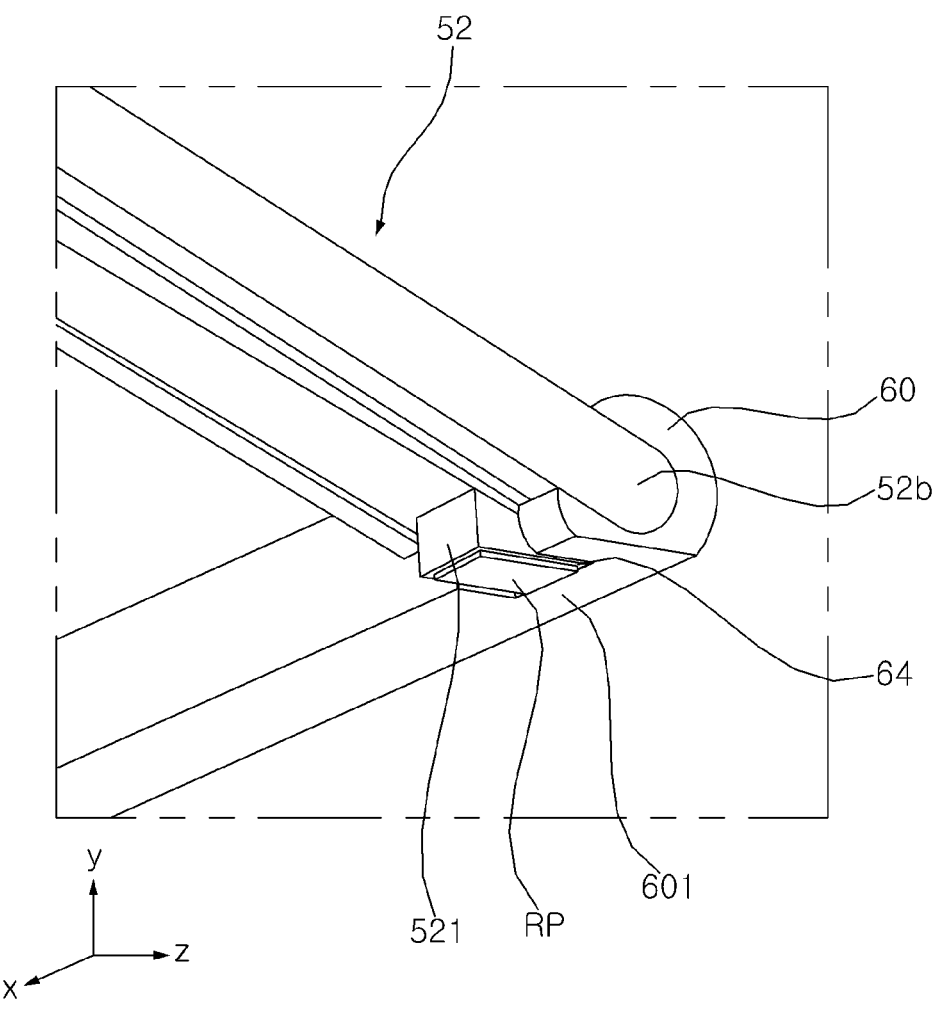

Referring to FIG. 14, a pad RP may be coupled to the lower surface of the first supporter 521. For example, the pad RP may include a rubber material. In this manner, the pad RP may prevent the stand 50 from slipping on the ground.

Further, as the pad RP is provided on the lower surface of the first supporter 521, the stand 50 may be maintained in position and level to the ground, before and after the bar 60 is coupled to the stand 50.

According to one aspect of the present disclosure, there is provided a display device including: a display panel; a frame disposed at a rear of the display panel and coupled to the display panel; a pair of stands coupled to a lower side of the frame and spaced apart from each other; a bar elongated and connecting the pair of stands; and a clip disposed between the bar and at least one of the pair of stands, fixed to at least one of the pair of stands or the bar, and removably coupled to the bar or at least one of the pair of stands.

In addition, according to another aspect of the present disclosure, the bar may further include a coupling part disposed at an end in a longitudinal direction of the bar and recessed from the bar toward an inside of the bar, wherein the stand may be inserted into the coupling part.

In addition, according to another aspect of the present disclosure, the coupling part may further include a fixing part which is recessed from the coupling part toward an inside of the coupling part, and to which the clip is fixed, wherein the clip may face the stand and may be removably coupled to the stand.

In addition, according to another aspect of the present disclosure, the clip may have at least a portion that is curved and may include an elastic material, wherein a portion of the stand may be curved corresponding to the curved portion of the clip, and a radius of curvature of the curved portion of the clip may be smaller than a radius of curvature of the curved portion of the stand.

In addition, according to another aspect of the present disclosure, the clip may further include a protruding part protruding from the clip toward the fixing part, wherein the fixing part may include: a first part recessed from the coupling part toward the inside of the coupling part; a second part which is connected to the first part, and on which the protruding part is placed; and a third part recessed from the first part toward an inside of the first part to form a step, wherein while coming into contact with the first part and the third part, the clip may be spaced apart from the third part in a region in which the protruding part is disposed.

In addition, according to another aspect of the present disclosure, when external force is applied to the clip in an inward direction of the coupling part, the protruding part is elastically deformed, such that the clip may move toward the third part in the region in which the protruding part is disposed.

In addition, according to another aspect of the present disclosure, the clip may have a hole formed adjacent to the protruding part, and the protruding part may have a hole formed therein.

In addition, according to another aspect of the present disclosure, before the clip is fixed to the fixing part, a width of the clip may be greater than a width of the fixing part.

In addition, according to another aspect of the present disclosure, when the clip is fixed to the fixing part, a portion of the clip may protrude from the coupling part.

In addition, according to another aspect of the present disclosure, at least a portion of the clip may be curved, and at least a portion of the coupling part may be curved to form a boundary of the fixing part, wherein a radius of curvature of the curved portion of the clip may be smaller than a radius of curvature of the curved portion of the coupling part.

In addition, according to another aspect of the present disclosure, each of the pair of stands may further include: a body coupled to the frame; a first leg elongated forward and downward from the body; and a second leg elongated rearward and downward from the body, wherein the first leg may be inclined forward at a first angle with respect to a virtual vertical line extending vertically by passing through a center of the body, and the second leg may be inclined rearward at a second angle with respect to the vertical line, wherein the first angle and the second angle may be acute angles.

In addition, according to another aspect of the present disclosure, the bar may be removably coupled to the first leg.

In addition, according to another aspect of the present disclosure, each of the pair of stands may further include a first supporter provided at a lower end of the first leg and having a flat lower surface with respect to a ground surface, wherein an outer circumferential surface of the bar may be partially cut-out such that the bar may have a flat lower surface with respect to the ground surface.

In addition, according to another aspect of the present disclosure, each of the pair of stands may further include a pad coupled to the lower surface of the first supporter.

In addition, according to another aspect of the present disclosure, the pair of stands may be coupled to the frame at a plurality of positions, wherein the bar may be adjustable in length according to a distance between the pair of stands.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device comprising: a display panel; a frame disposed at a rear of the display panel and coupled to the display panel; a pair of stands coupled to a lower side of the frame and spaced apart from each other; a bar elongated and connecting the pair of stands; and a clip disposed between the bar and at least one of the pair of stands, fixed to the bar, and to which the at least one of the pair of stands is removably coupled, wherein the clip is elastic, and at least a portion of the clip is curved, wherein a portion of the at least one of the pair of stands is curved to couple with the curved portion of the clip, wherein a radius of curvature of the curved portion of the clip is smaller than a radius of curvature of the curved portion of the at least one of the pair of stands; when the clip is coupled to the stand, coupling between the clip and the stand may be maintained by a force of the curved portion of the clip to return to its original state, unless an external force greater than or equal to a predetermined level is applied.

2. The display device of claim 1, wherein the bar further comprises a coupling part disposed at an end in a longitudinal direction of the bar and recessed from the bar toward an inside of the bar,
  wherein the at least one of the pair of stands is inserted into the coupling part.

3. The display device of claim 2, wherein the coupling part further comprises a fixing part which is recessed from the coupling part toward an inside of the coupling part, and to which the clip is fixed,
  wherein the clip faces the at least one of the pair of stands and is removably coupled to the at least one of the pair of stands.

4. The display device of claim 3, wherein the clip further comprises a protruding part protruding from the clip toward the fixing part, wherein the fixing part comprises:

a first part recessed from the coupling part toward an inside of the coupling part;

a second part which is connected to the first part, and on which the protruding part is placed; and a third part recessed from the first part toward an inside of the first part to form a step, wherein while coming into contact with the first part and the third part, the clip is spaced apart from the third part in a region in which the protruding part is disposed.

5. The display device of claim 4, wherein when external force is applied to the clip in an inward direction of the coupling part, the protruding part is elastically deformed, such that the clip moves toward the third part in the region in which the protruding part is disposed.

6. The display device of claim 5, wherein the clip has a hole formed adjacent to the protruding part, and the protruding part has a hole formed therein.

7. The display device of claim 3, wherein before the clip is fixed to the fixing part, a width of the clip is greater than a width of the fixing part.

8. The display device of claim 3, wherein when the clip is fixed to the fixing part, a portion of the clip protrudes from the coupling part.

9. The display device of claim 8, wherein at least a portion of the coupling part is curved to form a boundary of the fixing part, wherein a radius of curvature of the curved portion of the clip is smaller than a radius of curvature of a curved portion of the coupling part.

10. The display device of claim 1, wherein each of the pair of stands further comprises:

a body coupled to the frame;

a first leg elongated forward and downward from the body; and a second leg elongated rearward and downward from the body, wherein:

the first leg is inclined forward at a first angle with respect to a virtual vertical line extending vertically by passing through a center of the body; and the second leg is inclined rearward at a second angle with respect to the vertical line, wherein the first angle and the second angle are acute angles.

11. The display device of claim 10, wherein the bar is removably coupled to the first leg.

12. The display device of claim 11, wherein each of the pair of stands further comprises a first supporter provided at a lower end of the first leg and having a flat lower surface with respect to a ground surface, wherein an outer circumferential surface of the bar is partially cut-out such that the bar has a flat lower surface with respect to the ground surface.

13. The display device of claim 12, wherein each of the pair of stands further comprises a pad coupled to the lower surface of the first supporter.

14. The display device of claim 1, wherein the pair of stands are coupled to the frame at a plurality of positions, wherein the bar is adjustable in length according to a distance between the pair of stands.

* * * * *